US012593706B2

(12) United States Patent
Ng et al.

(10) Patent No.: US 12,593,706 B2
(45) Date of Patent: Mar. 31, 2026

(54) MULTI-CHIP PACKAGE WITH ENHANCED CONDUCTIVE LAYER ADHESION

(71) Applicant: Micron Technology, Inc., Boise, ID (US)

(72) Inventors: Hong Wan Ng, Singapore (SG); Seng Kim Ye, Singapore (SG); Kelvin Aik Boo Tan, Singapore (SG); Chin Hui Chong, Singapore (SG)

(73) Assignee: Micron Technology, Inc., Boise, ID (US)

( * ) Notice: Subject to any disclaimer, the term of this patent is extended or adjusted under 35 U.S.C. 154(b) by 566 days.

(21) Appl. No.: 17/823,349

(22) Filed: Aug. 30, 2022

(65) Prior Publication Data

US 2024/0071886 A1 Feb. 29, 2024

(51) Int. Cl.
| | |
|---|---|
| *H01L 23/498* | (2006.01) |
| *H01L 21/48* | (2006.01) |
| *H01L 21/56* | (2006.01) |
| *H01L 23/00* | (2006.01) |
| *H01L 23/29* | (2006.01) |
| *H01L 23/31* | (2006.01) |
| *H01L 25/065* | (2023.01) |

(52) U.S. Cl.
CPC .... *H01L 23/49838* (2013.01); *H01L 21/4846* (2013.01); *H01L 21/563* (2013.01); *H01L 23/293* (2013.01); *H01L 23/3107* (2013.01); *H01L 23/49866* (2013.01); *H01L 24/16* (2013.01); *H01L 24/48* (2013.01); *H01L 24/73* (2013.01); *H01L 25/0652* (2013.01); *H01L*

*2224/16225* (2013.01); *H01L 2224/48225* (2013.01); *H01L 2224/73207* (2013.01); *H01L 2224/73257* (2013.01); *H01L 2924/1433* (2013.01); *H01L 2924/1436* (2013.01); *H01L 2924/1438* (2013.01); *H01L 2924/182* (2013.01); *H01L 2924/186* (2013.01); *H01L 2924/35121* (2013.01)

(58) Field of Classification Search
None
See application file for complete search history.

(56) References Cited

U.S. PATENT DOCUMENTS

| | | | | |
|---|---|---|---|---|
| 6,166,430 A * | 12/2000 | Yamaguchi | ............. | H01L 24/06 |
| | | | | 257/E23.125 |
| 2003/0203539 A1* | 10/2003 | Islam | .................. | H01L 21/4832 |
| | | | | 438/111 |
| 2020/0357766 A1* | 11/2020 | Su | ............................ | H01L 23/16 |
| 2023/0091632 A1* | 3/2023 | Kageyama | ........ | H01L 23/49838 |
| | | | | 257/737 |

* cited by examiner

*Primary Examiner* — Cory W Eskridge
(74) *Attorney, Agent, or Firm* — Holland & Hart LLP

(57) ABSTRACT

Methods, systems, and devices for multi-chip package with enhanced conductive layer adhesion are described. In some examples, a conductive layer (e.g., a conductive trace) may be formed above a substrate. An integrated circuit may be bonded to the conductive layer and an encapsulant may be deposited at least between the integrated circuit and the conductive layer. In some examples, one or more surface features or one or more recesses may be formed on or within the conductive layer and the encapsulant may adhere to the surface features or recesses.

17 Claims, 6 Drawing Sheets

510

505

500-a

515

510

505

500-b

520

510

505

500-c

MULTI-CHIP PACKAGE WITH ENHANCED CONDUCTIVE LAYER ADHESION

FIELD OF TECHNOLOGY

The following relates to one or more systems for memory, including multi-chip package with enhanced conductive layer adhesion.

BACKGROUND

Memory devices are widely used to store information in various electronic devices such as computers, user devices, wireless communication devices, cameras, digital displays, and the like. Information is stored by programming memory cells within a memory device to various states. For example, binary memory cells may be programmed to one of two supported states, often corresponding to a logic 1 or a logic 0. In some examples, a single memory cell may support more than two possible states, any one of which may be stored by the memory cell. To access information stored by a memory device, a component may read (e.g., sense, detect, retrieve, identify, determine, evaluate) the state of one or more memory cells within the memory device. To store information, a component may write (e.g., program, set, assign) one or more memory cells within the memory device to corresponding states.

Various types of memory devices exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), 3-dimensional cross-point memory (3D cross point), not-or (NOR) and not-and (NAND) memory devices, and others. Memory devices may be described in terms of volatile configurations or non-volatile configurations. Volatile memory cells (e.g., DRAM) may lose their programmed states over time unless they are periodically refreshed by an external power source. Non-volatile memory cells (e.g., NAND) may maintain their programmed states for extended periods of time even in the absence of an external power source.

DETAILED DESCRIPTION

Some memory devices may include one or more one or more memory arrays and one or more controllers formed above a substrate. Such memory devices may be referred to as multi-chip packages. For example, a multi-chip package may include one or more volatile (e.g., dynamic random-access (DRAM)) memory arrays or one or more non-volatile (e.g., not-and (NAND)) memory arrays (or both) coupled with an application-specific integrated circuit (ASIC). In some instances, a conductive layer (e.g., a metal layer) may be formed above the substrate and the ASIC and memory arrays may be bonded to the conductive material. An encapsulant material may be deposited between the conductive layer and ASIC (and between the conductive layer and the memory arrays) to provide mechanical stability. However, delamination may occur between the conductive layer and the encapsulant material, which may reduce the mechanical stability of the multi-chip package. Accordingly, improved reliability for multi-chip packages is desirable.

A multi-chip package having features to reduce or mitigate delamination between an encapsulant material and a conductive layer is described herein. In some instances, a multi-chip package may include an ASIC that is bonded to a conductive layer (e.g., a metal layer, such as a copper (Cu) layer). As described herein, the ASIC may be bonded using a flip-chip or other, similar, type of connection. Prior to bonding the ASIC to the conductive layer, one or more surface features or recesses may be formed on or within conductive traces of the conductive layer. For example, one or more surface features (e.g., bumps, raised portions) may be formed above the conductive traces. The surface features may be a same material (e.g., Cu) as the conductive traces. Additionally or alternatively, one or more recesses (e.g., dimples, cavities) may be formed within the conductive traces. By forming surface features or recesses on or within the conductive traces, an encapsulant may adhere better to the traces, thus preventing or mitigating delamination that would otherwise occur due to the absence of the surface features or recesses.

Figure 1:
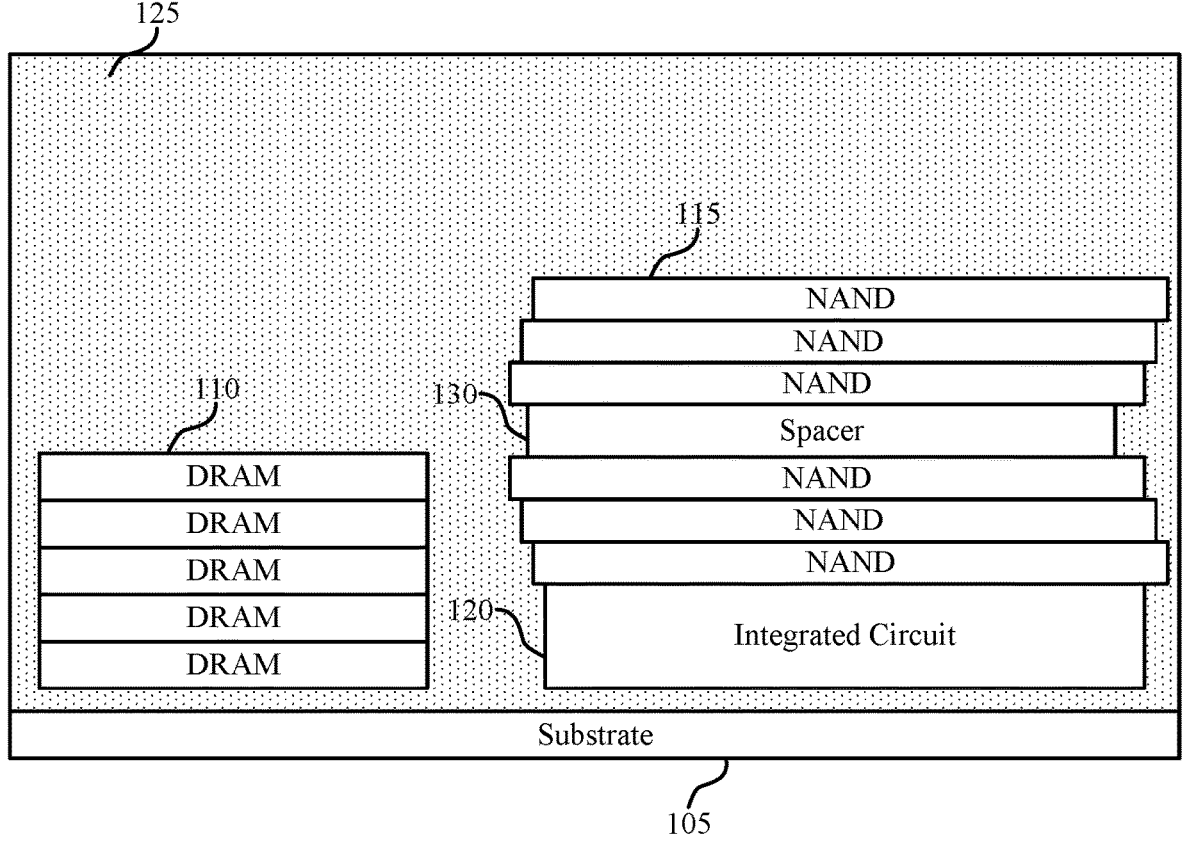
FIG. 1 illustrates an example of a multi-chip package that supports enhanced conductive layer adhesion in accordance with examples as disclosed herein.
Figure 2A:
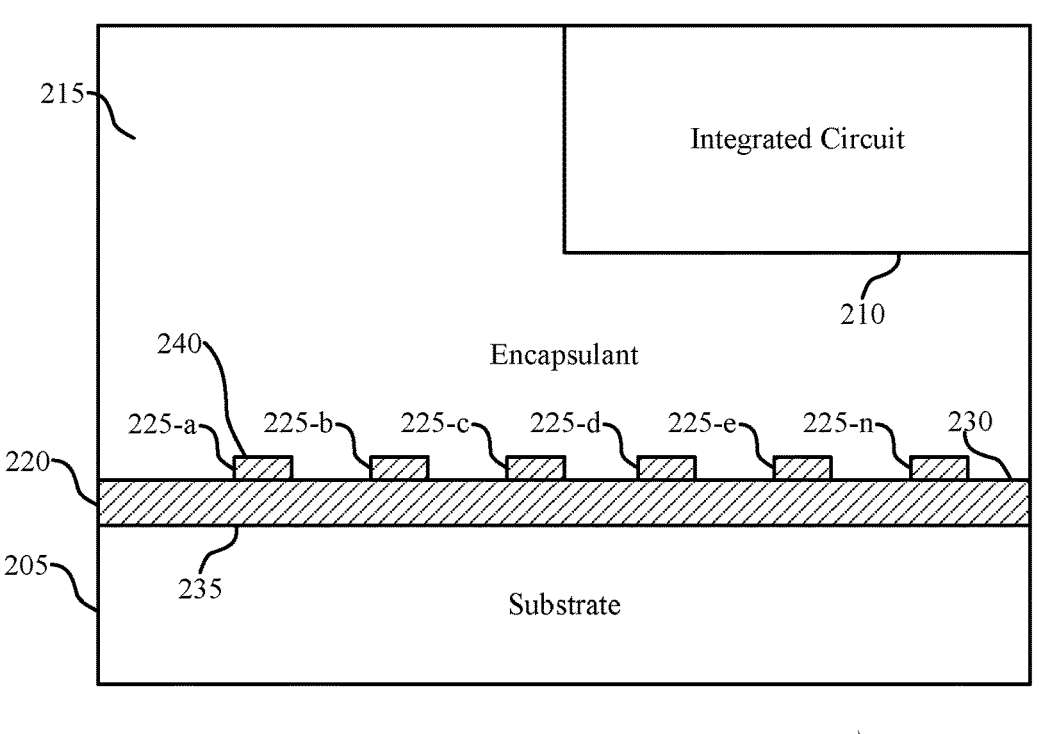
FIGS. 2A and 2B illustrate block diagrams that support multi-chip packages with enhanced conductive layer adhesion in accordance with examples as disclosed herein.
Figure 2B:
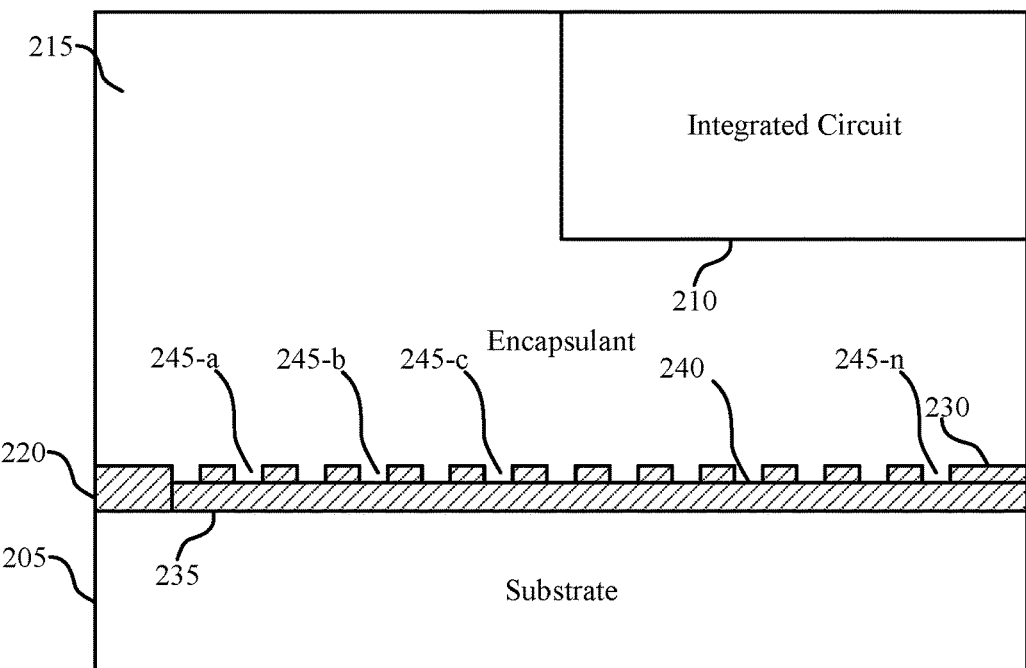

Features of the disclosure are initially described in the context of multi-chip packages and block diagrams with reference to FIGS. 1 through 2B. Features of the disclosure are described in the context of systems and process flow diagrams with reference to FIGS. 3 through 5C. These and other features of the disclosure are further illustrated by and described in the context of a flowchart that relates to multi-chip package with enhanced conductive layer adhesion with reference to FIG. 6.

FIG. 1 illustrates a multi-chip package 100 that supports enhanced conductive layer adhesion in accordance with examples as disclosed herein. In some instances, the multi-chip package 100 may include a substrate 105, which may be referred to as a printed circuit board (PCB) 105. The multi-chip package may include one or more volatile memory arrays 110 and one or more non-volatile memory arrays 115. As shown in FIG. 1, the volatile memory arrays 110 may be coupled with the substrate 105 and the non-volatile memory arrays 115 may be coupled with an integrated circuit 120 (e.g., an ASIC 120). An encapsulant 125 may be located above the substrate 105 and between the integrated circuit 120 (and non-volatile memory arrays 115) and the volatile memory arrays 110. Although not shown in FIG. 1, the encapsulant 125 may be in contact with one or more conductive materials (e.g., conductive traces) forming a layer of the substrate 105. By forming surface features or recesses on or within the conductive traces, the encapsulant 125 may adhere better to the traces, thus preventing or mitigating delamination that would otherwise occur due to the absence of the surface features or recesses.

In some instances, the integrated circuit 120 may be an example of an ASIC 120 that may control a memory system of the multi-chip package 100. That is, the integrated circuit 120 may be customized for management of the memory system, and may include logic circuits as well as one or more general purpose processors (GPPs)). The integrated circuit 120 may be bonded to a conductive layer (e.g., conductive traces) located above the substrate 105 (not shown). In some instances, the integrated circuit 120 may be bonded using a flip-chip bonding method (e.g., a controlled collapse chip connection). Such a connection may utilize one or more solder bumps that are deposited onto one or more pads of the integrated circuit 120. The integrated circuit 120 may then be flipped over and aligned with the multi-chip package 100 and the solder may be reflowed to complete the interconnect with the conductive traces. In other examples, the integrated circuit 120 may be coupled with the conductive trace via a pillar-type connection, via one or more wire bonds, or via a connection utilizing a combination of flip-chipping, pillar-type connections, and wire bonds.

As described herein, a multi-chip package 100 may include one or more memory arrays and an integrated circuit 120 (e.g., an ASIC 120). Although the multi-chip package 100 illustrates the volatile memory arrays 110 as being DRAM memory arrays 110 and the non-volatile memory arrays 115 as being NAND memory arrays 115, the multi-chip package 100 may include any types of memory arrays. For example, the multi-chip package 100 may include any type of volatile memory arrays 110, non-volatile memory arrays 115, or a combination thereof. Moreover, the volatile memory arrays 110 may be located in a stacked arrangement with integrated circuit 120 and the non-volatile memory arrays 115 may be located directly on the substrate 105 or vice versa (e.g., as shown). In some instances, the volatile memory arrays 110 may be bonded to a conductive layer (e.g., conductive traces) formed on the substrate 105 (not shown) via one or more wire bonds.

Additionally or alternatively, the multi-chip package 100 may include any quantity of memory arrays. For example, the multi-chip package 100 may include any quantity of volatile memory arrays 110 in a stacked configuration (e.g., any quantity of volatile memory arrays 110 stacked atop each other). Moreover, the multi-chip package 100 may include any quantity of non-volatile memory arrays 115 in a stacked configuration (e.g., any quantity of volatile memory arrays 110 stacked atop the integrated circuit 120 or stacked on the substrate 105 directly). The stack of volatile memory arrays 110 or non-volatile memory arrays 115 may include one or more spacers 130. As more memory arrays are stacked on top of the integrated circuit 120, the multi-chip package 100 may be subject to greater mechanical stresses. Accordingly, the encapsulant 125 may be used on and/or between (e.g., deposited adjacent to, above, below) the volatile memory arrays 110, the non-volatile memory arrays 115, and the integrated circuit 120.

The encapsulant 125 may be an example of an epoxy material, a potting compound, or a combination thereof. For example, the encapsulant may have a low dielectric constant (e.g., a low-k dielectric) and may be specifically formulated for flip-chip underfill such as having a low viscosity to substantially or fully fill gaps under an integrated circuit by way of capillary action. The encapsulant 125 may thus be an insulating material configured to provide mechanical stability to the multi-chip package 100. Because the encapsulant 125 may be deposited at least partly below the integrated circuit 120 (e.g., between the integrated circuit 120) and the conductive traces of the substrate 105, it may be desirable for the encapsulant 125 to adhere to the traces to prevent or mitigate delamination (e.g., separation between the encapsulant 125 and the traces). Accordingly, as described herein, one or more surface features or one or more recesses may be formed on or within the traces to improve the adhesion between the encapsulant 125 and the traces and thus prevent or mitigate delamination.

As described below with reference to FIGS. 2A and 2B, one or more surface features may be formed on a conductive trace or one or more recesses may be formed within a conductive trace. For example, during a fabrication process, one or more surface features (e.g., bumps, raised portions) may be formed atop the conductive trace. When the integrated circuit 120 is bonded to the conductive trace, the bonding may occur in regions other than where the surface features exist. That is, because the presence of the surface features may impede connections between the integrated circuit 120 and the substrate 105, it may be desirable to bond the integrated circuit 120 to portions of the traces other than where the surface features exist.

Similarly, during a fabrication process, one or more recesses (e.g., dimples) may be formed below an upper surface of the conductive trace. For example, the conductive trace may be formed and the recesses may be etched into the trace. When the integrated circuit 120 is bonded to the conductive trace, the bonding may occur in regions other than where the recesses exist. Accordingly, by forming surface features or recesses on or within the conductive traces, the encapsulant 125 may adhere better to the trace, thus preventing or mitigating delamination that would otherwise occur due to the absence of the surface features or recesses.

FIG. 2A illustrates a block diagram 200-*a* that supports multi-chip packages with enhanced conductive layer adhesion in accordance with examples as disclosed herein. The block diagram 200-*a* may illustrate aspects of a multi-chip package 100 as described with reference to FIG. 1. For example, the block diagram 200-*a* may illustrate a substrate 205, an integrated circuit 210, and an encapsulant 215, which may be examples of the substrate 105, the integrated circuit 120, and the encapsulant 125, respectively, as described with reference to FIG. 1. The block diagram 200-*a* may also illustrate one or more conductive layers 220 (e.g., one or more conductive traces 220) and one or more surface features 225 (e.g., surface features 225-*a*, 225-*b*, 225-*c*, 225-*d*, 225-*e*, and 225-*n*). By forming surface features or recesses on the conductive trace 220, the encapsulant 215 may adhere better to the conductive trace 220, thus preventing or mitigating delamination that would otherwise occur due to the absence of the surface features 225.

As shown in FIG. 2A, one or more surface features 225 may be formed above the conductive trace 220. For example, the conductive trace may have a first surface 230 and a third surface 235. At least a portion of the first surface 230 may be in contact with the encapsulant 215 and at least a portion of the third surface 235 may be in contact with the substrate 205 (e.g., the third surface 235 may be a bottom surface of the conductive trace 220). Moreover, each of the surface features 225 may have a second surface 240, which may be referred to as a second surface 240 of the surface feature 225 or a second surface 240 of the conductive trace 220.

The second surface 240 of each surface feature 225 may extend above the first surface of the conductive trace 220 in a first dimension (e.g., a vertical dimension such that the first surface 230 and the second surface 240 are noncoplanar), which may provide for improved adhesion between the encapsulant 215 and the conductive trace 220. That is, because the conductive trace 220 and each surface feature 225 may be a same material (e.g., Cu), the surface features 225 may effectively be an extension of the conductive trace 220. Moreover, the conductive trace 220 may include any quantity of surface features 225 (such as n surface features denoted by surface feature 225-n), which may be a matter of design choice.

Additionally or alternatively, the integrated circuit 210 may be bonded to the conductive trace 220 in areas of the conductive trace 220 that do not include surface features 225. For example, the integrated circuit 210 may be bonded to the first surface 230 of the conductive trace 220. By forming surface features 225 on the conductive trace 220, the encapsulant 215 may adhere better to the conductive trace 220, thus preventing or mitigating delamination that would otherwise occur due to the absence of the surface features 225.

FIG. 2B illustrates a block diagram 200-b that supports multi-chip packages with enhanced conductive layer adhesion in accordance with examples as disclosed herein. The block diagram 200-b may illustrate aspects of a multi-chip package 100 as described with reference to FIG. 1. For example, the block diagram 200-b may illustrate a substrate 205, an integrated circuit 210, and an encapsulant 215, which may be examples of the substrate 105, the integrated circuit 120, and the encapsulant 125, respectively, as described with reference to FIG. 1. The block diagram 200-b may also illustrate one or more conductive layers 220 (e.g., one or more conductive traces 220) and one or more recesses 245 (e.g., recesses 245-a, 245-b, 245-c, and 245-n). By forming surface features or recesses on the conductive trace 220, the encapsulant 215 may adhere better to the conductive trace 220, thus preventing or mitigating delamination that would otherwise occur due to the absence of the recesses 245.

As shown in FIG. 2B, one or more recesses 245 may be formed within the conductive trace 220. For example, the conductive trace may have a first surface 230 and a third surface 235. At least a portion of the first surface 230 may be in contact with the encapsulant 215 and at least a portion of the third surface 235 may be in contact with the substrate 205. Moreover, each of the recesses 245 may have a second surface 240, which may be referred to as a second surface 240 of the recess 245 or a second surface 240 of the conductive trace 220.

The second surface 240 of each recess 245 may extend below the first surface of the conductive trace 220 in a first dimension (e.g., a vertical dimension such that the first surface 230 and the second surface 240 are noncoplanar), which may provide for improved adhesion between the encapsulant 215 and the conductive trace 220. Moreover, the conductive trace 220 may include any quantity of recesses 245 (such as n surface features denoted by recess 245-n), which may be a matter of design choice.

Additionally or alternatively, the integrated circuit 210 may be bonded to the conductive trace 220 in areas of the conductive trace 220 that do not include recesses 245. For example, the integrated circuit 210 may be bonded to the first surface 230 of the conductive trace 220. By forming recesses 245 within the conductive trace 220, the encapsulant 215 may adhere better to the conductive trace 220, thus preventing or mitigating delamination that would otherwise occur due to the absence of the recesses 245.

Figure 3:
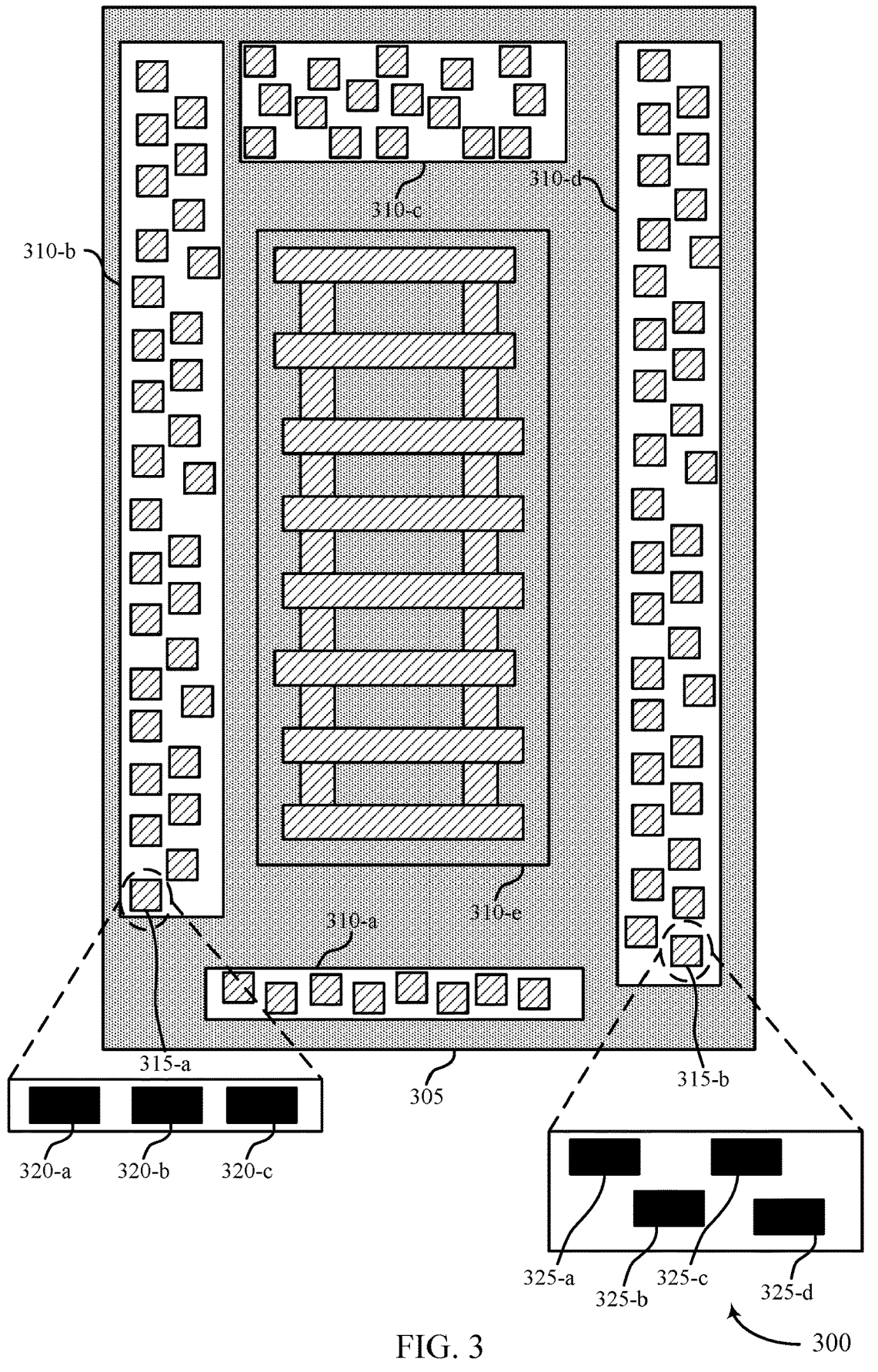
FIG. 3 illustrates an example of a circuit board that supports multi-chip package with enhanced conductive layer adhesion in accordance with examples as disclosed herein.

FIG. 3 illustrates an example of a circuit board 300 that supports multi-chip package with enhanced conductive layer adhesion in accordance with examples as disclosed herein. The circuit board 300 may include a substrate 305 and one or more regions 310 (e.g., regions 310-a, 310-b, 310-c, 310-d, and 310-e). Each region may include one or more conductive traces 315 that include one or more surface features (e.g., a surface feature 225 as described with reference to FIG. 2A) or one or more recesses (e.g., a recess 245 as described with reference to FIG. 2B). By forming surface features or recesses on or within the conductive traces 315, an encapsulant deposited over the substrate 305 and conductive traces 315 may adhere better to the conductive traces 315, thus preventing or mitigating delamination that would otherwise occur due to the absence of the surface features or recesses.

In some examples, the substrate 305 may include any quantity of regions 310. The regions may be located at different portions of the substrate 305 than illustrated in FIG. 3. Moreover, each region 310 may include any quantity of conductive traces 315, and each conductive trace 315 may be formed in any shape or direction. Additionally or alternatively, some or all of the conductive traces 315 of each region may include a surface feature, a recess, or both. Accordingly, the configuration of the circuit board 300 may be a matter of design choice that may be based on the type or quantity of components to be bonded to the circuit board 300.

As described herein, one or more components may be bonded to the conductive traces 315 of the circuit board 300. For example, an ASIC (e.g., an ASIC 120 as described with reference to FIG. 1) may be bonded to one or more conductive traces 315 of one or more regions 310. The ASIC (or any other components) may be bonded to areas of a respective trace (or traces) other than where the surface features or recesses exist. For example, the conductive trace 315-a may include surface features 320-a, 320-b, and 320-c. Accordingly, an ASIC (or other component) may be bonded to the conductive trace 315-a in an area other than where the surface features 320-a, 320-b, and 320-c exist.

Although the surface features 320-a, 320-b, and 320-c are illustrated as being generally rectangular, a surface feature 320 may be formed in any shape. That is, a surface feature may refer to any portion of conductive material that extends above a conductive trace (or a conductive plane) in a vertical direction. For example, a surface feature may be formed in the shape of a diamond, a square, a rectangle, a circle, an X, a hexagon, or any other shape.

Additionally or alternatively, the conductive trace 315-b may include recesses 325-a, 325-b, 325-c, and 325-d. In some instances, the conductive trace 315-b may be larger (e.g., wider) than the conductive trace 315-a in at least one direction. A collection of conductive traces 315 may be referred to as a conductive plane. An ASIC (or other component) may be bonded to the conductive trace 315-b in an area other than where the recesses 325-a, 325-b, 325-c, and 325-d exist. Although the recesses 325-a, 325-b, 325-c, and 325-d are illustrated as being generally rectangular, a recess 325 may be formed in any shape. That is, a recess may refer to any portion of conductive material that has one or more concave features (e.g., any portions that extend below an upper surface of the conductive material). For example, a recess may be formed in the shape of a diamond, a square, a rectangle, a circle, an X, a hexagon, or any other shape. By forming surface features or recesses on or within the conductive traces 315, an encapsulant deposited over the substrate 305 and conductive traces 315 may adhere better to the conductive traces 315, thus preventing or mitigating delamination that would otherwise occur due to the absence of the surface features or recesses.

Figure 4A:
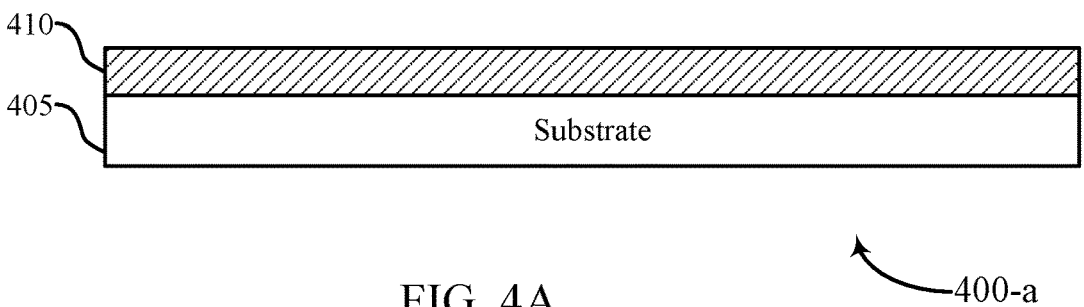
FIGS. 4A-4C illustrate the formation of aspects of a multi-surface conductive layer that supports multi-chip package with enhanced conductive layer adhesion in accordance with examples as disclosed herein.
Figure 4B:
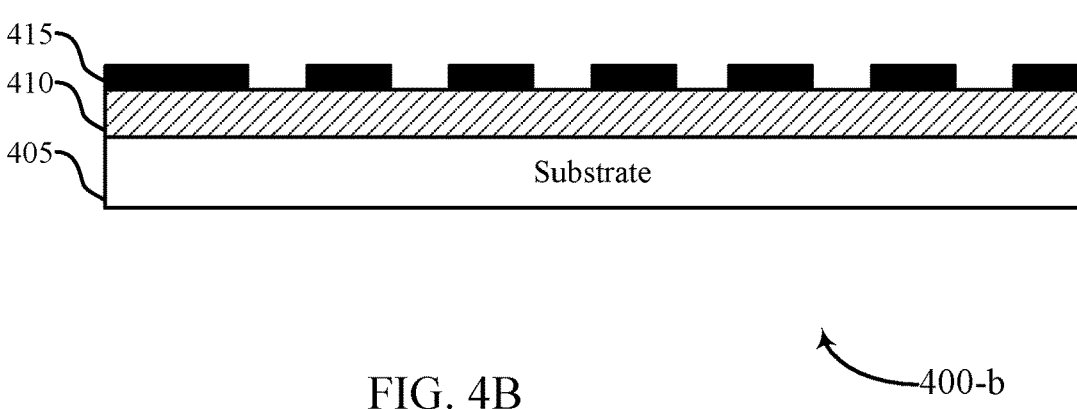
Figure 4C:
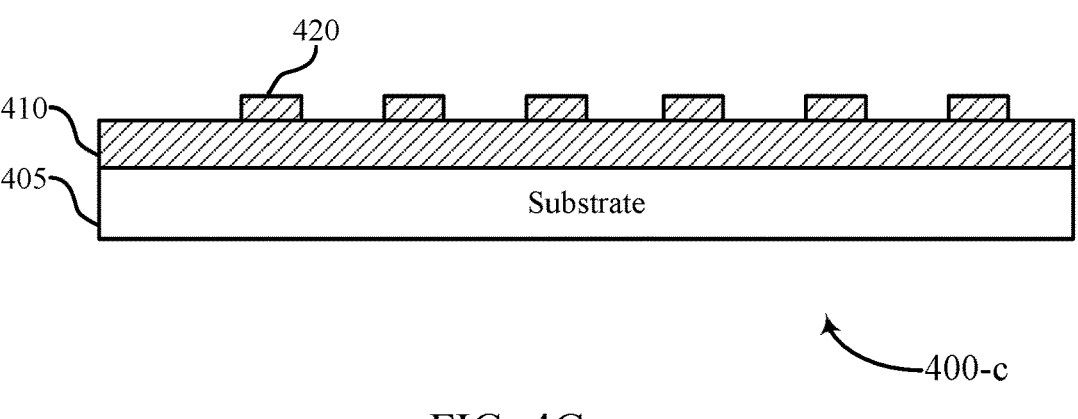

FIGS. 4A through 4C illustrate the formation of aspects of a multi-surface conductive layer that supports multi-chip package with enhanced conductive layer adhesion in accordance with examples as disclosed herein. For example, processing steps 400 illustrated in FIGS. 4A through 4C may show the formation of one or more surface features on a conductive trace. By forming surface features on the conductive traces, an encapsulant deposited over the substrate and conductive traces may adhere better to the conductive traces, thus preventing or mitigating delamination that would otherwise occur due to the absence of the surface features.

FIG. 4A illustrates a processing step 400-*a*. The processing step 400-*a* may illustrate the formation of a substrate 405 and a conductive material 410 above the substrate 405. In some instances, the conductive material 410 may be patterned (not shown) to form one or more conductive traces.

FIG. 4B illustrates a processing step 400-*b*. The processing step 400-*b* may illustrate the formation of a mask (e.g., using a masking material 415) above the conductive material 410. In some examples, the masking material 415 may be formed discontinuously over the upper surface of the conductive material 410. For example, the masking material 415 may be formed such that additional conductive material may be deposited over certain portions of the conductive material 410 to form one or more surface features.

FIG. 4C illustrates a processing step 400-*c*. The processing step 400-*b* may illustrate the formation of one or more surface features 420 above the conductive material 410. As described herein, the surface features 420 may be formed of a same material as the conductive material 410. To form the surface features, a conductive material (e.g., Cu) may be deposited over the masking material 415. The masking material 415 may then be removed (e.g., using an etching or photolithography process) and the surface features 420 may remain. By forming surface features 420 on the conductive material 410, an encapsulant deposited over the substrate and conductive material 410 may adhere better to the surface features 420, thus preventing or mitigating delamination that would otherwise occur due to the absence of the surface features 420.

Figure 5A:
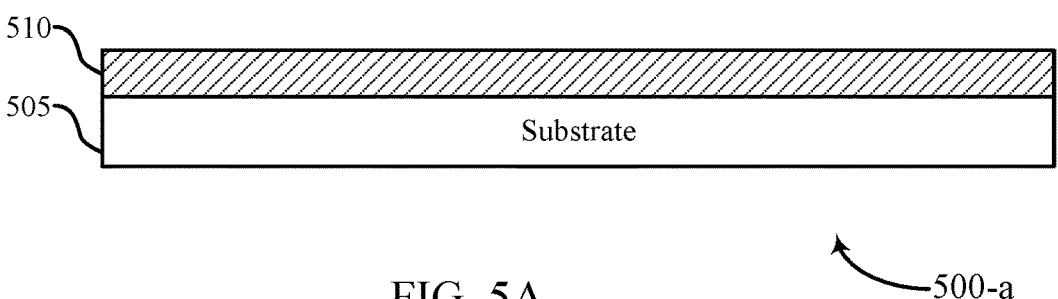
FIGS. 5A-5C illustrate the formation of aspects of a multi-surface conductive layer that supports multi-chip package with enhanced conductive layer adhesion in accordance with examples as disclosed herein.
Figure 5B:
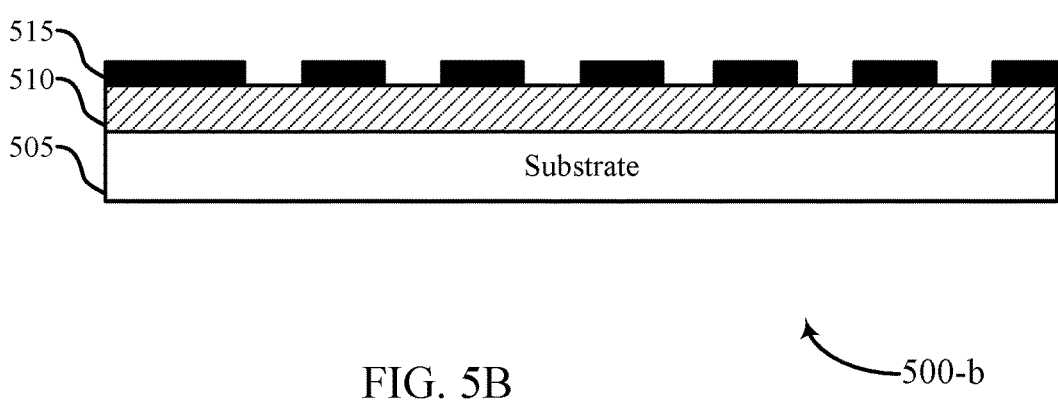
Figure 5C:
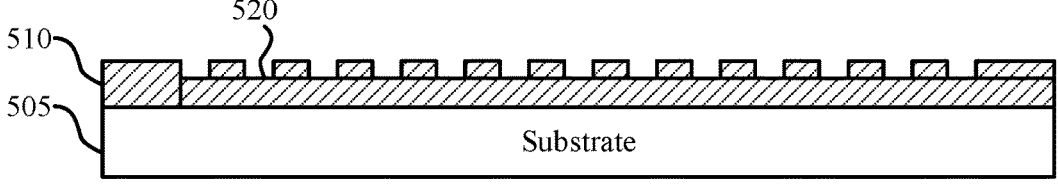
Figure 5C:
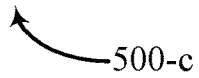

FIGS. 5A through 5C illustrate the formation of aspects of a multi-surface conductive layer that supports multi-chip package with enhanced conductive layer adhesion in accordance with examples as disclosed herein. For example, the processing steps 500 illustrated in FIGS. 5A through 5C may show the formation of one or more recesses in conductive trace. By forming recesses in the conductive traces, an encapsulant deposited over the substrate and conductive traces may adhere better to the recesses, thus preventing or mitigating delamination that would otherwise occur due to the absence of the recesses.

FIG. 5A illustrates a processing step d 500-*a*. The processing step 500-*a* may illustrate the formation of a substrate 505 and a conductive material 510 above the substrate 505. In some instances, the conductive material 510 may be patterned (not shown) to form one or more conductive traces. Additionally or alternatively, due to the subsequent etching steps to form one or more recesses, a greater quantity of conductive material 510 may be deposited than would ordinarily be deposited if no recesses were being formed.

FIG. 5B illustrates a processing step 500-*b*. The processing step 500-*b* may illustrate the formation of a mask (e.g., using a masking material 515) above the conductive material 510. In some examples, the masking material 515 may be formed discontinuously over the upper surface of the conductive material 510. For example, the masking material 515 may be formed such that portions of the conductive material 510 may be etched to form one or more recesses.

FIG. 5C illustrates a processing step 500-*c*. The processing step 500-*b* may illustrate the formation of one or more recesses 520 in the conductive material 510. As described herein, the recesses 520 may be formed of a same material as the conductive material 510. To form the recesses, the conductive material 510 may be etched using one or more etching processes (e.g., one or more wet etching or dry etching processes). The masking material 515 may then be removed (e.g., using an etching or photolithography process) and the recesses 520 may remain. By forming recesses 520 in the conductive material 510, an encapsulant deposited over the substrate and conductive material 510 may adhere better to the recesses 520, thus preventing or mitigating delamination that would otherwise occur due to the absence of the recesses 520.

Figure 6:
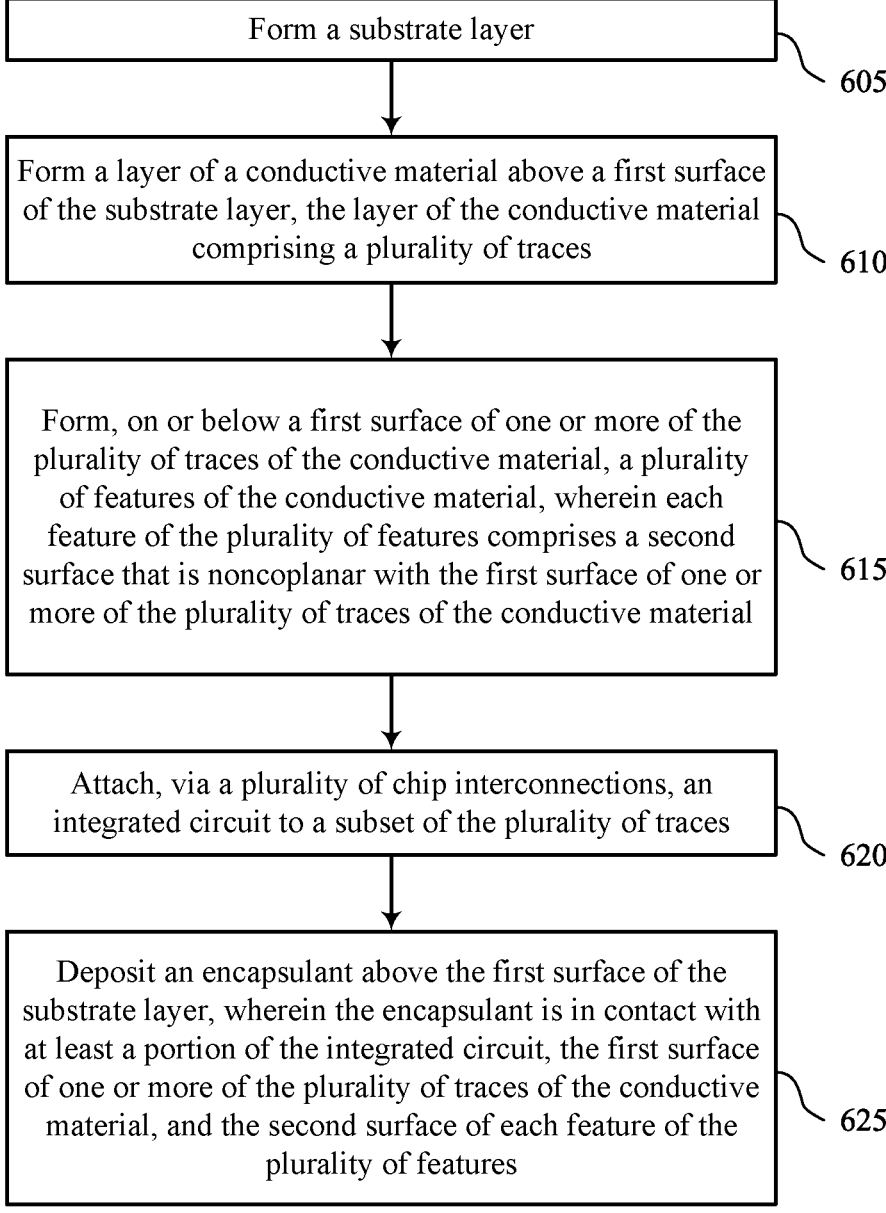
FIG. 6 shows a flowchart illustrating a method or methods that support multi-chip package with enhanced conductive layer adhesion in accordance with examples as disclosed herein.

FIG. 6 shows a flowchart illustrating a method 600 that supports multi-chip package with enhanced conductive layer adhesion in accordance with examples as disclosed herein. The operations of method 600 may be implemented by a manufacturing system or one or more controllers associated with a manufacturing system. In some examples, one or more controllers may execute a set of instructions to control one or more functional elements of the manufacturing system to perform the described functions. Additionally, or alternatively, one or more controllers may perform aspects of the described functions using special-purpose hardware.

At 605, the method may include forming a substrate layer. The operations of 605 may be performed in accordance with examples as disclosed herein.

At 640, the method may include forming a layer of a conductive material above a first surface of the substrate layer, the layer of the conductive material including a plurality of traces. The operations of 610 may be performed in accordance with examples as disclosed herein.

At 615, the method may include forming, on or below a first surface of one or more of the plurality of traces of the conductive material, a plurality of features of the conductive material, where each feature of the plurality of features includes a second surface that is noncoplanar with the first surface of one or more of the plurality of traces of the conductive material. The operations of 615 may be performed in accordance with examples as disclosed herein.

At 620, the method may include attaching, via a plurality of chip interconnections, an integrated circuit to a subset of the plurality of traces. The operations of 620 may be performed in accordance with examples as disclosed herein.

At 625, the method may include depositing an encapsulant above the first surface of the substrate layer, where the encapsulant is in contact with at least a portion of the integrated circuit, the first surface of one or more of the plurality of traces of the conductive material, and the second surface of each feature of the plurality of features. The operations of 625 may be performed in accordance with examples as disclosed herein.

In some examples, an apparatus as described herein may perform a method or methods, such as the method 600. The apparatus may include features, circuitry, logic, means, or instructions (e.g., a non-transitory computer-readable medium storing instructions executable by a processor), or any combination thereof for performing the following aspects of the present disclosure:

Aspect 1: A method, apparatus, or non-transitory computer-readable medium including operations, features, circuitry, logic, means, or instructions, or any combination thereof for forming a substrate layer; forming a layer of a conductive material above a first surface of the substrate layer, the layer of the conductive material including a plurality of traces; forming, on or below a first surface of one or more of the plurality of traces of the conductive material, a plurality of features of the conductive material, where each feature of the plurality of features includes a second surface that is noncoplanar with the first surface of one or more of the plurality of traces of the conductive material; attaching, via a plurality of chip interconnections, an integrated circuit to a subset of the plurality of traces; and depositing an encapsulant above the first surface of the substrate layer, where the encapsulant is in contact with at least a portion of the integrated circuit, the first surface of one or more of the plurality of traces of the conductive material, and the second surface of each feature of the plurality of features.

Aspect 2: The method, apparatus, or non-transitory computer-readable medium of aspect 1, where forming the plurality of features of the conductive material includes operations, features, circuitry, logic, means, or instructions, or any combination thereof for depositing the conductive material above the first surface of one or more of the plurality of traces of the conductive material and etching the conductive material above the first surface of one or more of the plurality of traces of the conductive material.

Aspect 3: The method, apparatus, or non-transitory computer-readable medium of aspect 2, where the conductive material above the first surface of one or more of the plurality of traces of the conductive material is etched in a shape of a hexagon, a circle, a square, a rectangle, or a diamond.

Aspect 4: The method, apparatus, or non-transitory computer-readable medium of any of aspects 1 through 3, where forming the plurality of features of the conductive material includes operations, features, circuitry, logic, means, or instructions, or any combination thereof for etching the first surface of one or more of the plurality of traces of the conductive material to form a plurality of recesses.

It should be noted that the described techniques include possible implementations, and that the operations and the steps may be rearranged or otherwise modified and that other implementations are possible. Further, portions from two or more of the methods may be combined.

An apparatus is described. The following provides an overview of aspects of the apparatus as described herein:

Aspect 5: An apparatus, including: a circuit board including: a substrate layer; an encapsulant; and a conductive layer disposed on the substrate layer and in contact with the encapsulant, the conductive layer including one or more surface features configured to increase adhesion between the conductive layer and the encapsulant.

Aspect 6: The apparatus of aspect 5, further including: an integrated circuit coupled with a portion of a first surface of the conductive layer via a plurality of chip connections, where the plurality of chip connections include one or more solder bumps, one or more pillar-type connections, one or more wire bonds, or a combination thereof.

Aspect 7: The apparatus of aspect 6, where the encapsulant is in contact with at least a portion of a first surface and a portion of a second surface of the integrated circuit.

Aspect 8: The apparatus of any of aspects 6 through 7, where each solder bump of the one or more solder bumps includes a third surface different than the first surface of the conductive layer and a second surface of the conductive layer.

Aspect 9: The apparatus of any of aspects 5 through 8, where a second surface of the conductive layer is offset from a first surface of the conductive layer along a first dimension.

Aspect 10: The apparatus of aspect 9, where the conductive layer includes a plurality of surface features, each surface feature of the plurality of surface features includes a respective portion of the second surface of the conductive layer.

Aspect 11: The apparatus of any of aspects 5 through 10, where a second surface of the conductive layer includes a plurality of surface features, each surface feature having a shape of a hexagon, a circle, a square, a rectangle, or a diamond.

Aspect 12: The apparatus of any of aspects 5 through 11, where the encapsulant includes a potting compound, an epoxy material, or a combination thereof.

Aspect 13: The apparatus of any of aspects 5 through 12, where the conductive layer includes copper.

An apparatus is described. The following provides an overview of aspects of the apparatus as described herein:

Aspect 14: An apparatus, including: a circuit board including: a substrate layer; an encapsulant; and a conductive layer disposed on the substrate layer and in contact with the encapsulant, the conductive layer including one or more recesses configured to increase adhesion between the conductive layer and the encapsulant.

Aspect 15: The apparatus of aspect 14, further including: an integrated circuit coupled with a portion of a first surface of the conductive layer via a plurality of chip connections, where the plurality of chip connections include one or more solder bumps, one or more pillar-type connections, one or more wire bonds, or a combination thereof.

Aspect 16: The apparatus of aspect 15, where the encapsulant is in contact with at least a portion of a first surface and a portion of a second surface of the integrated circuit.

Aspect 17: The apparatus of any of aspects 15 through 16, where each solder bump of the one or more solder bumps includes a third surface different than the first surface of the conductive layer and a second surface of the conductive layer.

Aspect 18: The apparatus of any of aspects 14 through 17, where a second surface of the conductive layer is offset from a first surface of the conductive layer along a first dimension.

Aspect 19: The apparatus of aspect 18, where the conductive layer includes a plurality of recesses, each recess of the plurality of recesses includes a respective portion of a second surface of the conductive layer.

Aspect 20: The apparatus of any of aspects 14 through 19, where at least a portion of the encapsulant extends below a first surface of the conductive layer.

Aspect 21: The apparatus of any of aspects 14 through 20, where the encapsulant includes a potting compound, an epoxy material, or a combination thereof.

Aspect 22: The apparatus of any of aspects 14 through 21, where the conductive layer includes copper.

Information and signals described herein may be represented using any of a variety of different technologies and techniques. For example, data, instructions, commands, information, signals, bits, symbols, and chips that may be referenced throughout the description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to a condition of moving from an open-circuit relationship between components in which signals are not presently capable of being communicated between the components over a conductive path to a closed-circuit relationship between components in which signals are capable of being communicated between components over the conductive path. If a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other if the switch is open. If a controller isolates two components, the controller affects a change that prevents signals from flowing between the components using a conductive path that previously permitted signals to flow.

The term "layer" or "level" used herein refers to a stratum or sheet of a geometrical structure (e.g., relative to a substrate). Each layer or level may have three dimensions (e.g., height, width, and depth) and may cover at least a portion of a surface. For example, a layer or level may be a three dimensional structure where two dimensions are greater than a third, e.g., a thin-film. Layers or levels may include different elements, components, and/or materials. In some examples, one layer or level may be composed of two or more sublayers or sublevels.

As used herein, the term "substantially" means that the modified characteristic (e.g., a verb or adjective modified by the term substantially) need not be absolute but is close enough to achieve the advantages of the characteristic.

As used herein, the term "electrode" may refer to an electrical conductor, and in some examples, may be employed as an electrical contact to a memory cell or other component of a memory array. An electrode may include a trace, wire, conductive line, conductive layer, or the like that provides a conductive path between elements or components of a memory array.

The terms "if," "when," "based on," or "based at least in part on" may be used interchangeably. In some examples, if the terms "if," "when," "based on," or "based at least in part on" are used to describe a conditional action, a conditional process, or connection between portions of a process, the terms may be interchangeable.

The term "in response to" may refer to one condition or action occurring at least partially, if not fully, as a result of a previous condition or action. For example, a first condition or action may be performed and second condition or action may at least partially occur as a result of the previous condition or action occurring (whether directly after or after one or more other intermediate conditions or actions occurring after the first condition or action).

Additionally, the terms "directly in response to" or "in direct response to" may refer to one condition or action occurring as a direct result of a previous condition or action. In some examples, a first condition or action may be performed and second condition or action may occur directly as a result of the previous condition or action occurring independent of whether other conditions or actions occur. In some examples, a first condition or action may be performed and second condition or action may occur directly as a result of the previous condition or action occurring, such that no other intermediate conditions or actions occur between the earlier condition or action and the second condition or action or a limited quantity of one or more intermediate steps or actions occur between the earlier condition or action and the second condition or action. Any condition or action described herein as being performed "based on," "based at least in part on," or "in response to" some other step, action, event, or condition may additionally, or alternatively (e.g., in an alternative example), be performed "in direct response to" or "directly in response to" such other condition or action unless otherwise specified.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In some other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as an n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" if a voltage greater than or equal to the transistor's threshold voltage is applied to the transistor gate. The transistor may be "off" or "deactivated" if a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration" and not "preferred" or "advantageous over other examples." The detailed description includes specific details to provide an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a hyphen and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over, as one or more instructions or code, a computer-readable medium. Other examples and implementations are within the scope of the disclosure and appended claims. For example, due to the nature of software, the described functions can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and components described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include CD, laser disc, optical disc, digital versatile disc (DVD), floppy disk, and Blu-ray disc, where disks usually reproduce data magnetically, while discs reproduce data optically with lasers. Combinations of these are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. An apparatus, comprising:
a circuit board comprising:
a substrate layer;
an encapsulant; and
a conductive layer disposed on the substrate layer and in contact with the encapsulant, the conductive layer comprising a plurality of surface features, the conductive layer comprising a first surface and a third surface, the third surface in contact with the substrate layer, wherein each of the plurality of surface features comprises a respective portion of a second surface of the conductive layer that extends above the first surface, wherein the second surface of the conductive layer is offset from the first surface of the conductive layer along a first dimension, the plurality of surface features configured to increase adhesion between the conductive layer and the encapsulant.

2. The apparatus of claim 1, further comprising:
an integrated circuit coupled with a portion of the first surface of the conductive layer via a plurality of chip connections, wherein the plurality of chip connections comprise one or more solder bumps, one or more pillar-type connections, one or more wire bonds, or a combination thereof.

3. The apparatus of claim 2, wherein the encapsulant is in contact with at least a portion of a first surface of the integrated circuit and a portion of a second surface of the integrated circuit.

4. The apparatus of claim 2, wherein each solder bump of the one or more solder bumps comprises a third surface different than the first surface of the conductive layer and the second surface of the conductive layer.

5. The apparatus of claim 1, wherein each surface feature of the plurality of surface features has a shape of a hexagon, a circle, a square, a rectangle, or a diamond.

6. The apparatus of claim 1, wherein the encapsulant comprises a potting compound, an epoxy material, or a combination thereof.

7. The apparatus of claim 1, wherein the conductive layer comprises copper.

8. An apparatus, comprising:
a circuit board comprising:
   a substrate layer;
   an encapsulant;
   a conductive layer disposed on the substrate layer and in contact with the encapsulant, the conductive layer comprising a plurality of recesses configured to increase adhesion between the conductive layer and the encapsulant, the conductive layer comprising a first surface and a second surface that is offset from the first surface along a first dimension, wherein each recess of the plurality of recesses comprises a respective portion of the second surface of the conductive layer; and
   an integrated circuit coupled with a first surface of the conductive layer via a plurality of chip connections, wherein the integrated circuit is above the conductive layer and the encapsulant extends between the integrated circuit and the conductive layer in a vertical direction, and wherein the vertical direction is perpendicular to a plane defined by the substrate layer.

9. The apparatus of claim 8,
wherein the plurality of chip connections comprise one or more solder bumps, one or more pillar-type connections, one or more wire bonds, or a combination thereof.

10. The apparatus of claim 9, wherein the encapsulant is in contact with at least a portion of a first surface of the integrated circuit and a portion of a second surface of the integrated circuit.

11. The apparatus of claim 9, wherein each solder bump of the one or more solder bumps comprises a third surface different than the first surface of the conductive layer and the second surface of the conductive layer.

12. The apparatus of claim 8, wherein at least a portion of the encapsulant extends below the first surface of the conductive layer.

13. The apparatus of claim 8, wherein the encapsulant comprises a potting compound, an epoxy material, or a combination thereof.

14. The apparatus of claim 8, wherein the conductive layer comprises copper.

15. A method, comprising:
forming a substrate layer;
forming a layer of a conductive material above a first surface of the substrate layer, the layer of the conductive material comprising a plurality of traces;
forming, on a first surface of one or more of the plurality of traces of the conductive material, a plurality of features of the conductive material, wherein each feature of the plurality of features comprises a second surface that is noncoplanar with the first surface of one or more of the plurality of traces of the conductive material, wherein at least a portion of the first surface is exposed after forming the plurality of features, wherein forming the plurality of features comprises:
   depositing the conductive material above the first surface of one or more of the plurality of traces of the conductive material; and
   attaching, via a plurality of chip interconnections, an integrated circuit to a subset of the plurality of traces; and
depositing an encapsulant above the first surface of the substrate layer, wherein the encapsulant is in contact with at least a portion of the integrated circuit, the first surface of one or more of the plurality of traces of the conductive material, and the second surface of each feature of the plurality of features.

16. The method of claim 15, wherein forming the plurality of features of the conductive material further comprises:
etching the conductive material above the first surface of one or more of the plurality of traces of the conductive material.

17. The method of claim 16, wherein the conductive material above the first surface of one or more of the plurality of traces of the conductive material is etched in a shape of a hexagon, a circle, a square, a rectangle, or a diamond.

* * * * *